US011302387B2

(12) United States Patent
Lee

(10) Patent No.: US 11,302,387 B2
(45) Date of Patent: Apr. 12, 2022

(54) INPUT/OUTPUT CAPACITANCE MEASUREMENT, AND RELATED METHODS, DEVICES, AND SYSTEMS

(71) Applicant: Micron Technology, Inc., Boise, ID (US)

(72) Inventor: Hyunui Lee, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 16/927,535

(22) Filed: Jul. 13, 2020

(65) Prior Publication Data

US 2022/0013164 A1 Jan. 13, 2022

(51) Int. Cl.
| | |
|---|---|
| *H03K 19/0185* | (2006.01) |
| *H03K 3/00* | (2006.01) |
| *H03K 3/356* | (2006.01) |
| *G11C 11/4096* | (2006.01) |
| *H03K 5/24* | (2006.01) |
| *G01R 27/26* | (2006.01) |
| *G11C 11/4076* | (2006.01) |
| *H03K 3/037* | (2006.01) |

(52) U.S. Cl.
CPC ...... *G11C 11/4096* (2013.01); *G01R 27/2605* (2013.01); *G11C 11/4076* (2013.01); *H03K 3/037* (2013.01); *H03K 5/24* (2013.01)

(58) Field of Classification Search
CPC ............ G11C 11/4096; G11C 11/4076; G01R 27/2605; H03K 3/037; H03K 5/24
USPC ........................................................ 711/105
See application file for complete search history.

(56) References Cited

U.S. PATENT DOCUMENTS

| | | | | |
|---|---|---|---|---|
| 6,163,180 | A  * | 12/2000 | Hidaka | H03K 19/00361 327/112 |
| 6,201,437 | B1 * | 3/2001 | Kono | G05F 1/465 327/143 |
| 6,426,671 | B1 * | 7/2002 | Kono | G05F 5/00 327/541 |
| 2002/0031032 | A1 * | 3/2002 | Ooishi | G11C 5/143 365/226 |
| 2005/0180066 | A1 * | 8/2005 | Hamaguchi | G11B 20/10046 361/18 |
| 2005/0230730 | A1 * | 10/2005 | Tanzawa | H03L 7/0895 257/296 |
| 2013/0169324 | A1 * | 7/2013 | Huang | H03K 4/502 327/126 |

(Continued)

*Primary Examiner* — Ly D Pham
(74) *Attorney, Agent, or Firm* — TraskBritt

(57) ABSTRACT

A device may include a current source configured to couple a charged node to a ground voltage to generate a current. The device may include a second circuit coupled to the node and configured to compare, beginning during a first clock cycle of a clock signal and for each clock cycle of a number of clock cycles of the clock signal, the voltage at the node to a reference voltage to generate a result. The device may further include a control unit configured to: detect, upon completion of a subsequent clock cycle of the clock signal, a change in the result; determine, in response to the change in the result, a transition time based on a number of elapsed clock cycles from the first clock cycle to completion of the subsequent clock cycle; and determine a capacitance of the node based on the transition time. Related systems and methods are also described.

20 Claims, 10 Drawing Sheets

(56) References Cited

U.S. PATENT DOCUMENTS

| | | | |
|---|---|---|---|
| 2013/0207708 A1* | 8/2013 | Agrawal | H03K 5/135 327/237 |
| 2014/0070784 A1* | 3/2014 | Lynch | G05F 1/46 323/283 |
| 2014/0203852 A1* | 7/2014 | Tamura | G01R 31/31709 327/155 |
| 2017/0108980 A1* | 4/2017 | Wu | G06F 3/0416 |
| 2018/0269895 A1* | 9/2018 | Kim | H03F 3/2175 |

* cited by examiner

INPUT/OUTPUT CAPACITANCE MEASUREMENT, AND RELATED METHODS, DEVICES, AND SYSTEMS

TECHNICAL FIELD

Embodiments of the disclosure relate to input/output capacitance measurement. More specifically, various embodiments relate to measuring an input/output capacitance of a semiconductor device, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

A memory device stores digital data in an array of memory cells. To read information from such an array, a memory cell is sensed for the presence or absence of charge. The information may amplified and transferred from the memory device. Typically, an output driver, which may be coupled to or is part of an output buffer, may be used to transfer the information from the memory device.

DETAILED DESCRIPTION

Various embodiments of the present disclosure relate to systems, devices, and methods for measuring an input/output (I/O) capacitance of a device (e.g., a semiconductor device). More specifically, some embodiments relate to measuring a capacitance of I/O pin of a device. According to some embodiments, a capacitance of an I/O pin of a device may be measured without contacting the I/O pin (e.g., without contacting the I/O pin with a measurement tool, such as a measurement probe). As a non-limiting example, various embodiments may be useful for measuring I/O capacitances of devices having a relatively small I/O interfaces (e.g., micro bump ("uBump") interfaces), such as, but not limited to, a high-bandwidth memory (HBM) devices.

Figure 1:
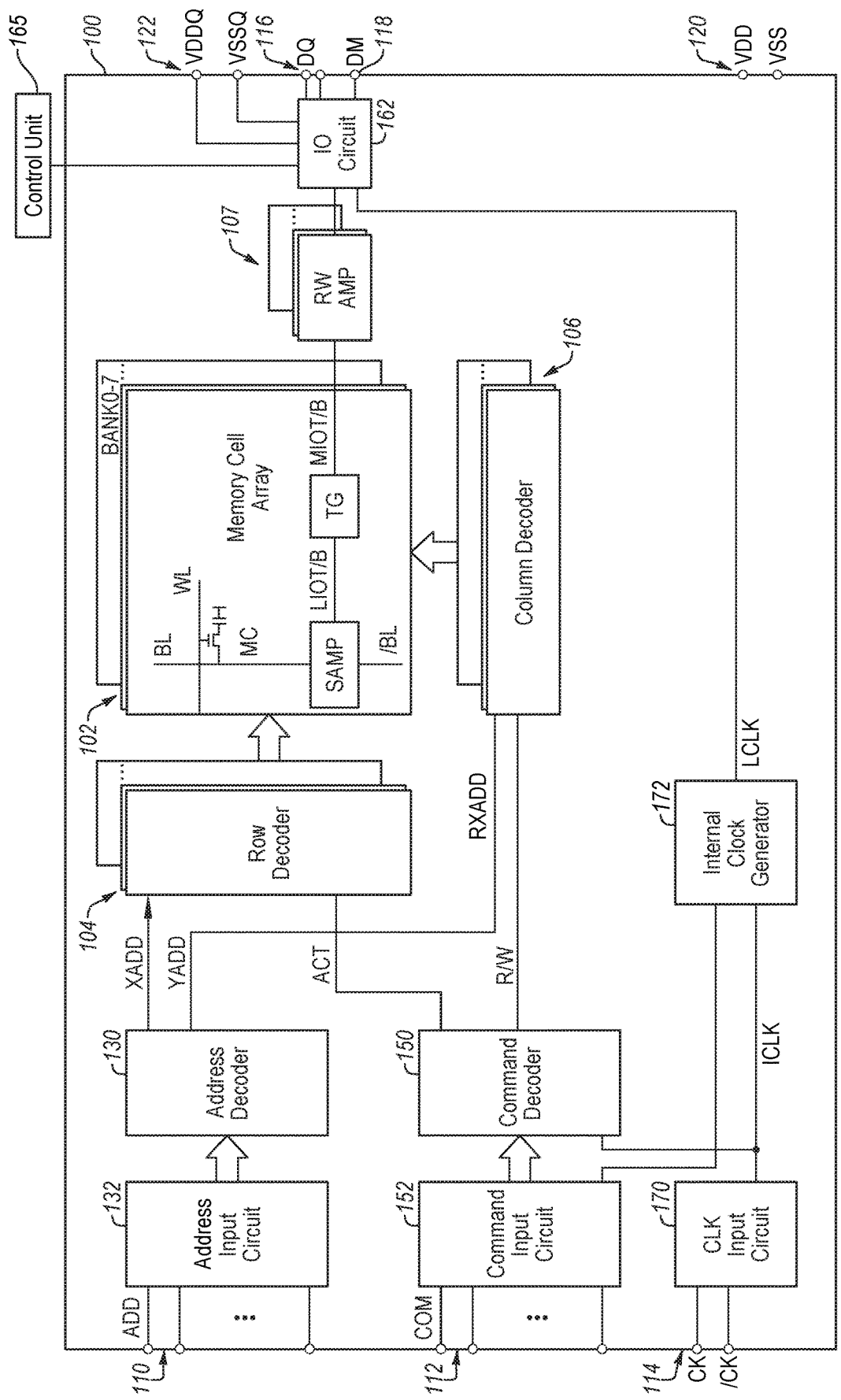
FIG. 1 is a block diagram of an example memory device, according to various embodiments of the present disclosure.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and/BL, and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or/BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

As described more fully below, a semiconductor device (e.g., a memory device, such as memory device 100) may include one or more interface regions including a number of rows (or a number columns) of bond pads. More specifically, an interface region may include one or more rows of power supply pads (e.g., for coupling to a power supply terminal) and one or more rows of input/output (DQ) pads (also referred to herein as "data pads") (e.g., for coupling to a data terminal). For example, bond pads (not shown in FIG. 1) of memory device 100 may include, or may be coupled to, terminals 116, 118, 120, and/or 122 shown in FIG. 1.

Moreover, in one or more embodiments, input/output circuit 162 may include one or more output buffers and/or one or more input buffers, as described more fully below. Further, as described below, and in accordance with various embodiments of the present disclosure, input/output circuit 162 may include and/or may be coupled to a current source, which may be coupled to an I/O pad (e.g., DQ pad) (i.e., for coupling to a terminal, such as DQ terminal 116). In these embodiments, as described more fully below, an I/O capacitance (e.g., at the I/O pad or an I/O pin) may be measured without contacting (e.g., directly contacting) the I/O pad with a measurement tool (e.g., a probe).

According to some embodiments, memory device 100 may include and/or may be coupled to a control unit 165. As described more fully below, control unit 165, which may also be referred to herein as a "controller" or "test unit," may be configured to send one or more signals (e.g., control signals, clock signals, without limitation) to memory device 100. Further, as described more fully below, control unit 165 may be configured to receive one or more signals (e.g., comparison result signals) from memory device 100. In some embodiments, as described herein, control unit 165 may be configured to determine an I/O capacitance (e.g., of an I/O pin or an I/O pad) of memory device 100 (e.g., in response to one or more signals (e.g., comparison result signals) from memory device 100). It is noted that, collectively, memory device 100 and control unit 165 may be referred to herein a "memory device," a "memory system," a "device," or a "system." It is further noted that although control unit 165 is depicted as being external to memory device 100, the present disclosure is not so limited, and in some embodiments, control unit 165 may part of memory device 100.

As will be appreciated by a person having ordinary skill in the art, high-bandwidth memory (HBM) devices may be used in high-performance computing applications, such as graphics and server applications. In some memory systems (e.g., HBM systems), an interposer may be used to connect between a host and a HBM device. Using an interposer in an HBM system may provide better signal integrity than conventional DRAM products (e.g., because the interposer includes resistance and capacitance). Further, in some memory systems, a HBM device, and possibly, a host, may be connected to an interposer via a micro bump, which has a very small diameter (e.g., 25 um).

Figure 2:
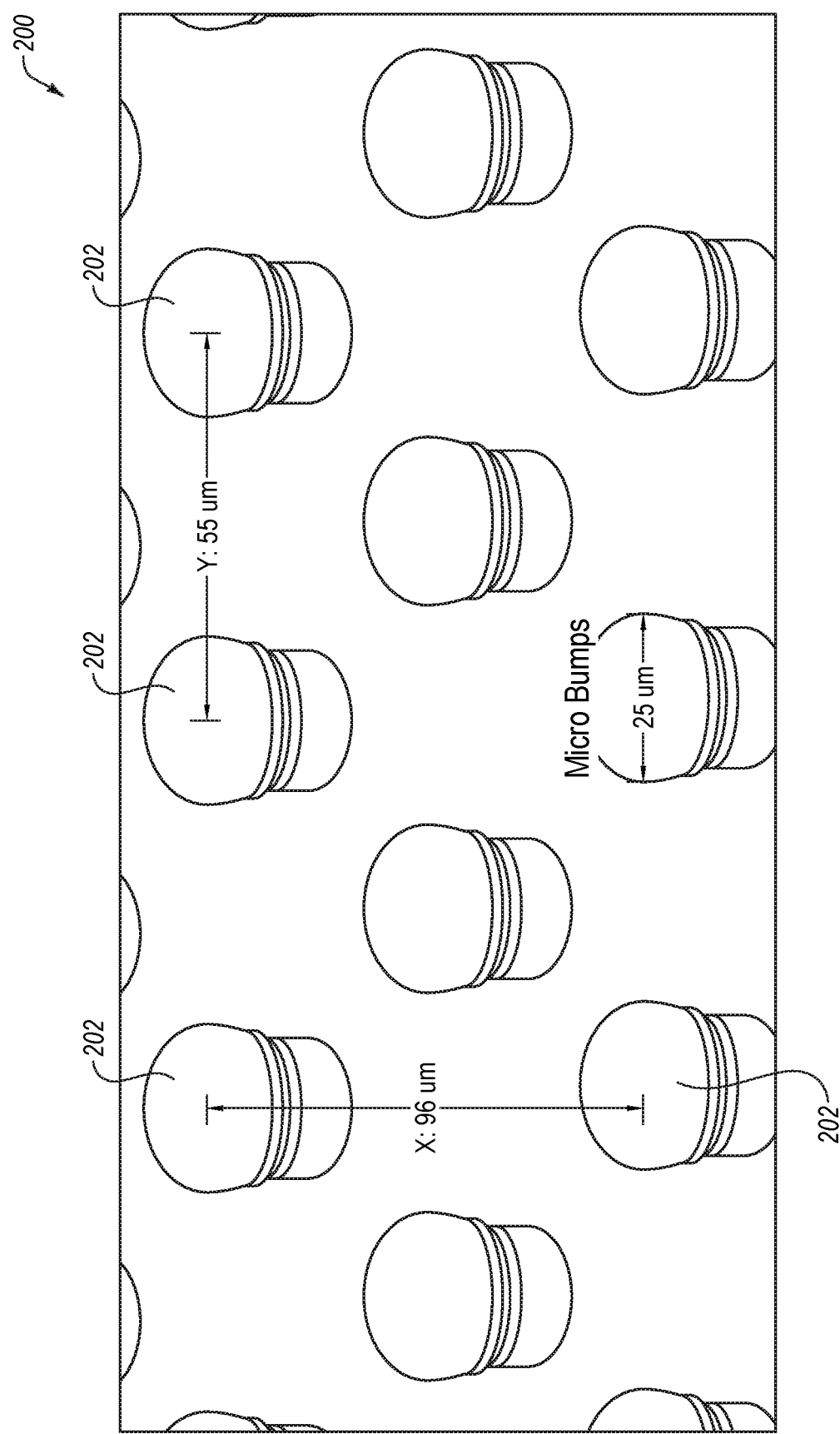
FIG. 2 depicts a micro bump interface including a number of micro bumps.

FIG. 2 depicts an interface 200 including a number of micro bumps ("uBumps") 202. In this example, uBumps have a diameter of approximately 25 um. Further, an X pitch of interface 200 is approximately 55 um, and a Y pitch is approximately 96 um. Due to the small diameter and narrow pitches of interface 200, it may be difficult to contact uBump 202 directly, which increases the difficulty of performing one or more tests, such as wafer level tests.

Figure 3A:
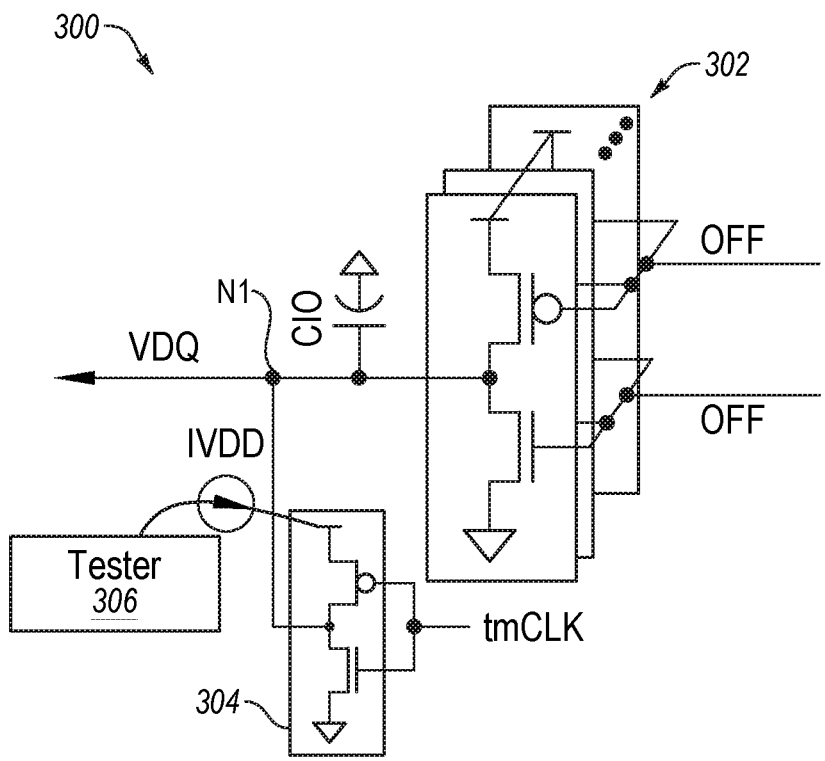
FIG. 3A depicts an example input/output circuit of a semiconductor device.
Figure 3B:
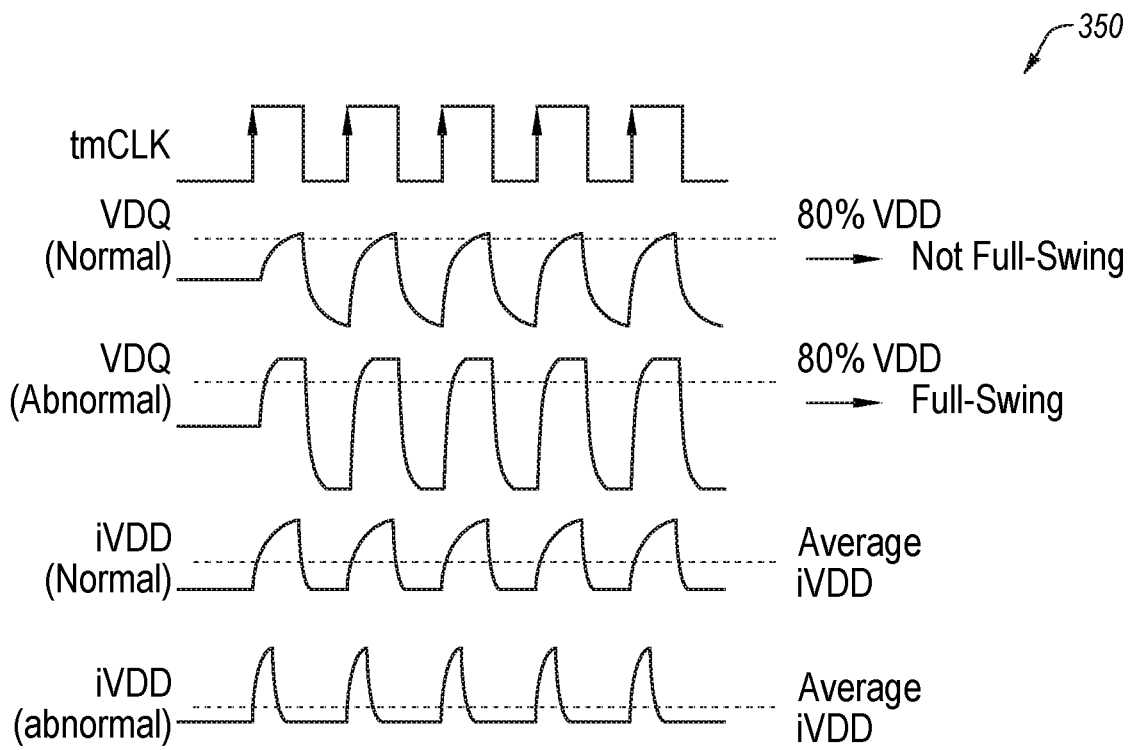
FIG. 3B includes a timing diagram depicting various signals associated with the input/output circuit shown in FIG. 3A.

FIG. 3A depicts an I/O circuit 300 of a device (e.g., an HBM device), wherein I/O circuit 300 may be used to measure a capacitance of an I/O ("DQ") node. More specifically, I/O circuit 300, which includes an output buffer 302 and a current driver 304, may be used to measure a capacitance of an output node N1 (also referred to as a "VDQ node"). In FIG. 3A, other components are omitted, such as an input receiver and ESD. FIG. 3B includes a timing diagram 350 associated with an example operation of I/O circuit 300.

During measurement of a pin capacitance CIO, output buffer 302 is turned off, and current driver 304, which receives a current from a tester 306, is toggled via a clock tmCLK. If a current generated via current driver 304 is small enough, a voltage VDQ at node N1 cannot swing to a full-range (e.g., as shown in FIG. 3B, the swing range is drawn as 80% of an operating voltage VDD), and an average current iVDD through current driver 304 may be indicative of pin capacitance CIO. In a different scenario (e.g., an abnormal scenario including, for example, a metal disconnect (e.g., at node N1)), pin capacitance CIO may be decreased, and voltage VDQ may swing a full-range and average current iVDD may be decreased.

Pin capacitance CIO may be measured based on average current iVDD. However, because pin capacitance CIO is very small (e.g., in HBM devices, the pin capacitance CIO spec is 0.4 pF), it is difficult to realize a sufficiently small current driver for target operation, especially if the current driver is connected to node N1 (i.e., thus limiting the size of the current driver and structure due to reliability issues). Moreover, in some conventional devices, a high speed and fine duty clock (i.e., to generate clock signal tmCLK), which is difficult to implement (i.e., due to lack of area), may be necessary for accurate measurements.

Figure 4A:
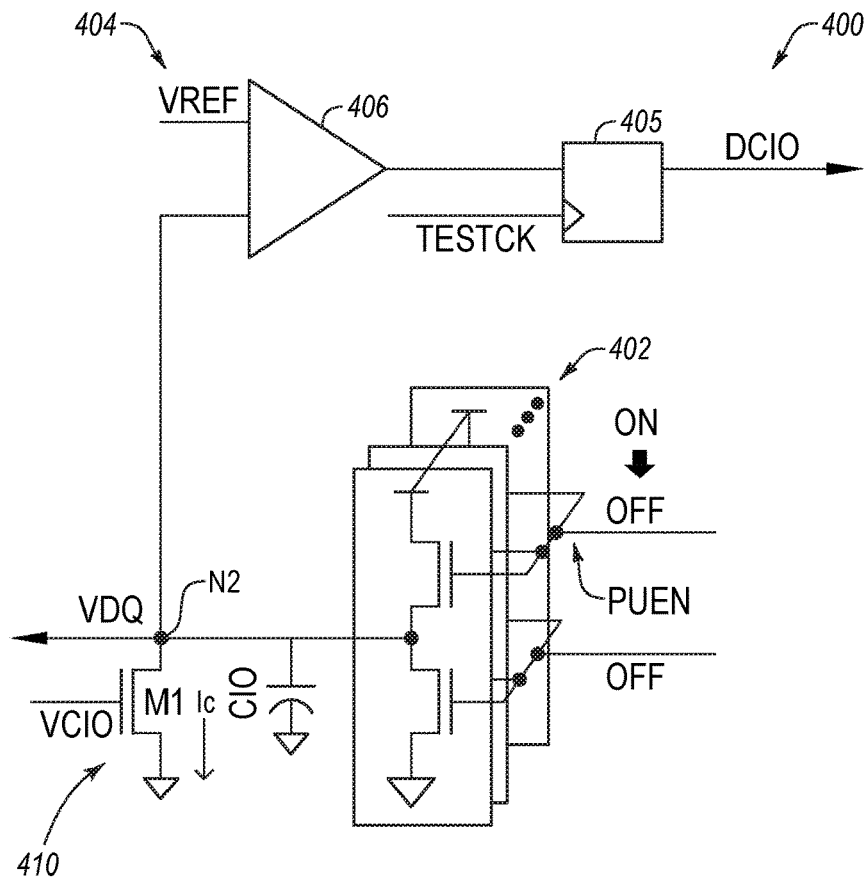
FIG. 4A depicts an example circuit of a semiconductor device, according to various embodiments of the present disclosure.

FIG. 4A depicts a circuit 400 (also referred to herein as a "DQ circuit" or an "I/O circuit"), according to various embodiments of the present disclosure. According to some embodiments, circuit 400, which may be part of a semiconductor device (e.g., memory device 100 of FIG. 1 or another memory device), may be used to measure a capacitance of I/O node N2. A "capacitance of I/O node N2" may also referred to herein as a "pin capacitance."

As illustrated, circuit 400 includes an output buffer 402, an input buffer 404, and a flip-flop 405. For example, input buffer 404 may operate as a comparator 406. According to various embodiments, output buffer 402 may be configured to charge a voltage at node N2 (e.g., voltage VDQ at an I/O pin) to a voltage, such as an operating voltage VDD (also referred to herein as a "supply voltage" or "high-side supply voltage"). Further, input buffer 404 may be configured to compare voltage VDQ with a reference voltage VREF. Flip-flop 405 may be configured to store an output of comparator 406 and read out a comparison result in response to receipt of an edge (e.g., a rising or falling edge) of a clock signal TESTCK. For example, the comparison result may be read out from flip-flop 405 via a test interface, such as a direct access (DA) path.

Further, according to various embodiments, circuit 400 includes a current source 410, which includes a transistor M1. In this example, transistor M1 is implemented as an NMOS transistor, however, as described more fully below, in other embodiments, a current source of a circuit may include a PMOS transistor. According to various embodiments, during a contemplated operation of circuit 400, a voltage applied to a gate of transistor M1 may be any voltage level such that transistor M1 operates in a saturation region. While operating in the saturation region, a current Ic, which may be a constant current, is generated through node N2 (i.e., at an I/O pin) (also referred to herein an "I/O node" or "I/O pad").

Figure 4B:
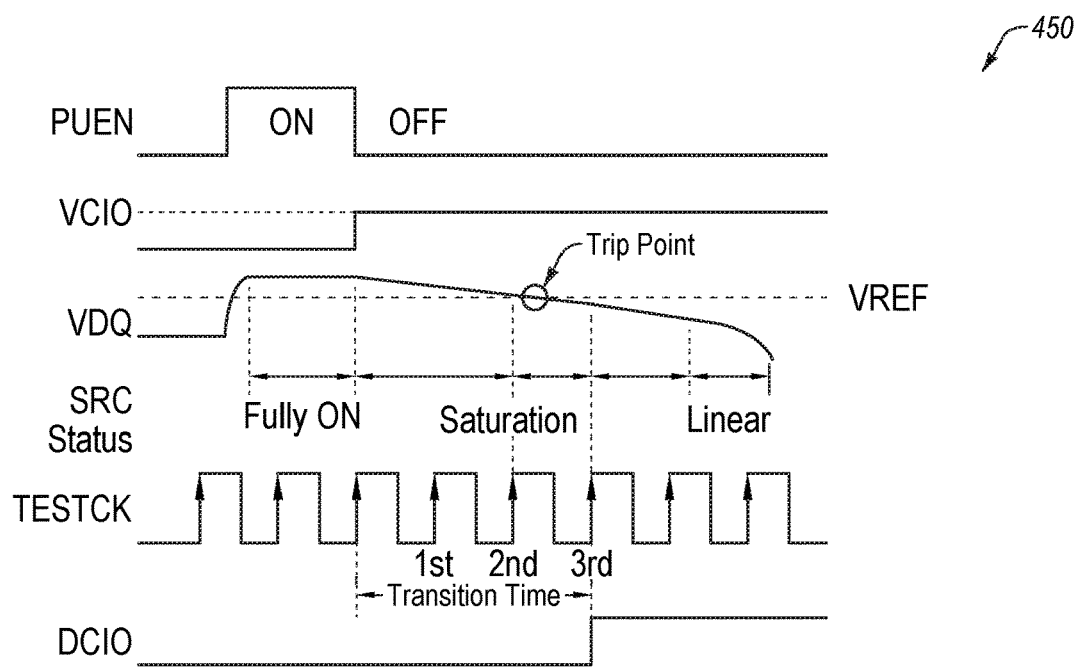
FIG. 4B includes a timing diagram depicting various signals associated with the circuit shown in FIG. 4A.

FIG. 4B depicts a timing diagram 450 including various signals associated with circuit 400 of FIG. 4A. With reference to FIGS. 4A and 4B, a contemplated operation of circuit 400 will now be described. Initially, a pull-up enable signal PUEN goes high (ON), which turns on a pull-up driver of output buffer 402, and voltage VDQ at node N2 is charged to a level substantially equal to a voltage, such as operating voltage VDD. Subsequently, the pull-up enable signal PUEN goes low (OFF), and substantially simultaneously, voltage VCIO transitions to a voltage level (e.g., half of operating VDD voltage) such that current source 410 operates in the saturation region (i.e., transistor M1 conducts). Moreover, in response to voltage VCIO rising, a transition time (e.g., a designated first clock cycle of clock signal TESTCK) may begin. Further, voltage VDQ starts to decrease (i.e., in response to current source 410 operating in the saturation region), as shown in FIG. 4B. Moreover, flip-flop 405 latches an output of comparator 406 (i.e., a comparison result). As will be appreciated, upon receipt of an edge (e.g., rising edge) of clock signal TESTCK, flip-flop 405 may output a comparison result DCIO (e.g., that may be read out via an interface during each clock cycle of clock signal TESTCK).

As shown in FIG. 4B, after a certain amount of time has passed (e.g., after a number of clock cycles of clock signal TESTCK), voltage VDQ may decrease to a level less than a level of voltage reference VREF (i.e., voltage VDQ crosses voltage reference VREF at "Trip Point"), and thus an output of comparator 406 switches (i.e., the comparison result is changed). Further, upon receipt of the next rising edge of clock signal TESTCK, flip-flop 405 outputs comparison result DCIO, which, in this example, has transitioned from low to high. In this example, the rising edge of clock signal TESTCK is the last edge of a third clock cycle (i.e., since voltage DCIO transitioned high). Thus, in this example, the number of elapsed clock cycles is three (3). In other words, there are three (3) elapsed clock cycles from the first clock cycle to completion of the third clock cycle.

Since the number of elapsed clock cycles of clock signal TESTCK and a frequency of clock signal TESTCK are known, a transition time may be calculated (i.e., time (period)=1/f (frequency)). Also, a magnitude of current Ic (i.e., generated via current source 410) and reference voltage VREF are known (e.g., the magnitude of current Ic generated via current source 410 and reference voltage VREF may be set during design). Further, pin capacitance CIO can be calculated via equation (1) below:

$$\text{Pin Capacitance } CIO = (\text{Current } Ic * \text{Transition Time}) / (\text{Operating Voltage } VDD - \text{Reference Voltage VREF}). \quad (1)$$

Since a saturation region of current source 410 may depend on voltage VDQ, voltage reference VREF may be set sufficiently high to provide accurate results. If voltage reference VREF is set too low, transistor M1 may operate in a linear region (i.e., rather than a saturation region), and a magnitude of current Ic may increase, and an accuracy of a capacitance measurement may be reduced.

As will be appreciated, the accuracy of capacitance measurements may be affected by various factors, such as a size of a current source (e.g., current source 410) and/or a gate voltage of a transistor of the current source (e.g., voltage VCIO), which may change based on process, voltage, and/or temperature (PVT) variations. According to some embodiments, a replica circuit including a probe pad may be used to verify and/or increase accuracy and/or reliability of measurements.

Figure 5:
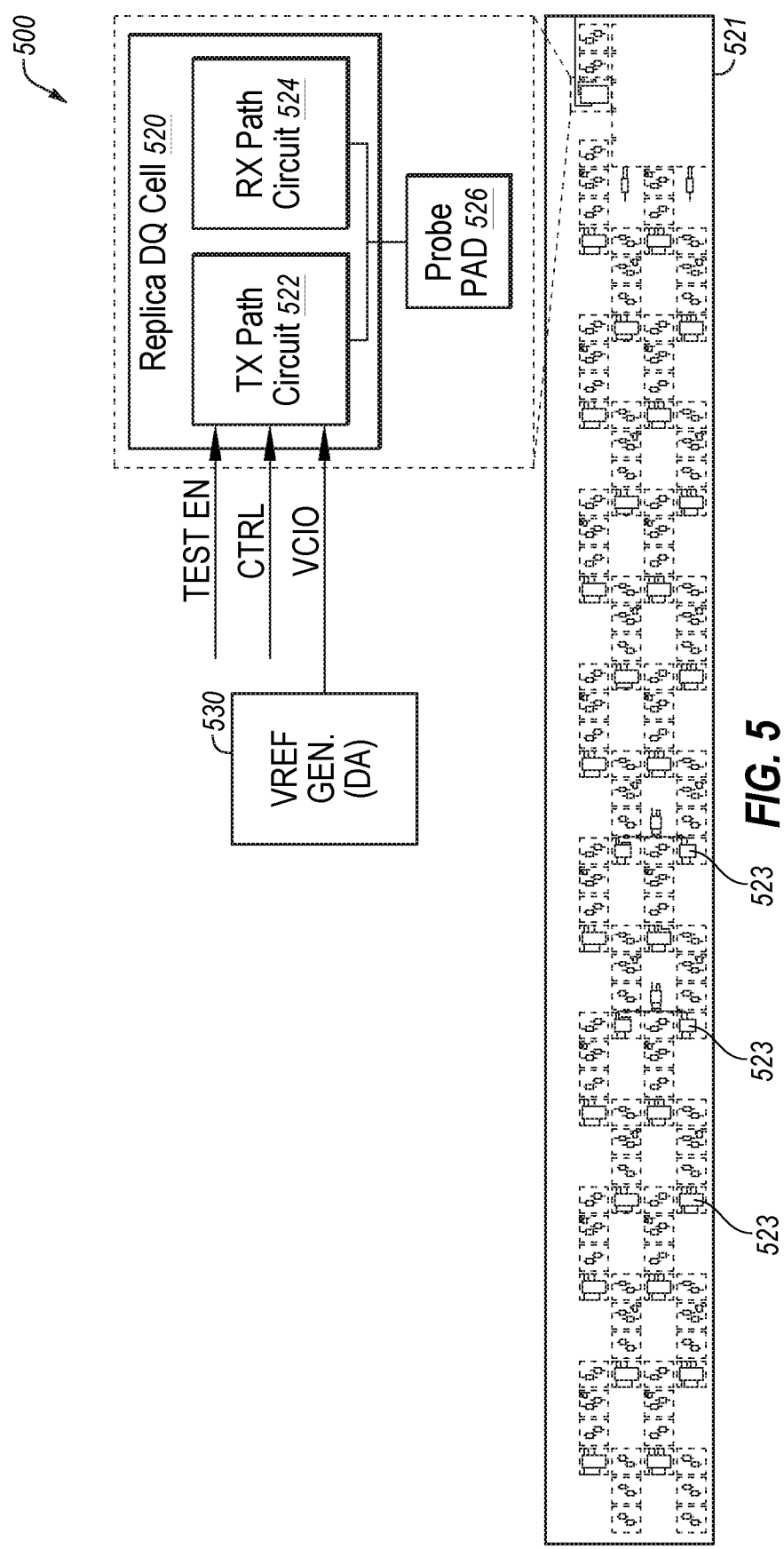
FIG. 5 depicts an example semiconductor device including a replica DQ cell including a probe pad, according to various embodiments of the present disclosure.

FIG. 5 illustrates a portion of a semiconductor device 500 including a replica DQ cell 520 of an interface area 521 (e.g., a direct access (DA) interface), according to various embodiments of the present disclosure. Interface area 521 includes a number of probe pads 523. For example, semiconductor device 500 may include an HBM device or any other semiconductor device including a probe pad. Replica DQ cell 520 includes a transmit circuit path 522, a receive circuit path 524, a probe pad 526, and a signal generator 530. For example, transmit circuit path 522 and/or receive circuit path 524 may include circuit 400 (see FIG. 4), or portions thereof.

According to various embodiments, replica DQ cell 520 may be used (e.g., during a wafer level test) to verify results and/or compensate for one or more variations (e.g., PVT variations) that may affect capacitance measurements, as described above. For example, initially, a pin capacitance of replica DQ cell 520 may be measured via probe pad 526 (i.e., via direct contact (e.g., with a measurement too) on probe pad 526). Further, the pin capacitance of replica DQ cell 520 may be measured via the same or similar process as described above with reference to FIGS. 4A and 4B (referred to hereinafter as "the measurement method").

If the pin capacitance measured via probe pad 526 is substantially equal to the pin capacitance measured via the measurement method, it may be determined that the measurement method may provide accurate measurements (e.g., the PVT variations are not severe enough to cause inaccuracies). On the other hand, if the pin capacitance measured via probe pad 526 is not substantially equal to the pin capacitance measured via the measurement method, it may be determined that the measurement method may not provide accurate measurements, and one or more adjustments may be needed.

In one example, a value of a reference voltage (i.e., reference voltage VCIO) used during the measurement method may be adjusted. More specifically, for example, a voltage sweep of voltage reference VCIO may be performed to identify a specific value for voltage reference VCIO (see FIGS. 4A and 4B) such that the pin capacitance measured via the measurement method is substantially equal to the pin capacitance measured via probe pad 526. In other words, it may be determined which value of voltage reference VCIO provides a pin capacitance (i.e., measured via the measurement method) that is substantially equal to the pin capacitance measured via probe pad 526.

After performing the voltage sweep to determine the value of voltage reference VCIO that provides the correct pin capacitance, the determined value of voltage reference VCIO may be used to perform the measurement method (e.g., for each I/O pin of a device). Thus, even with some PVT variation, a circuit (e.g., circuit 400 of FIG. 4A) and/or a parameter for each DQ cell of semiconductor device 500 may be calibrated to provide accurate pin capacitance measurements (e.g., without directly contacting DQ pins).

Figure 6:
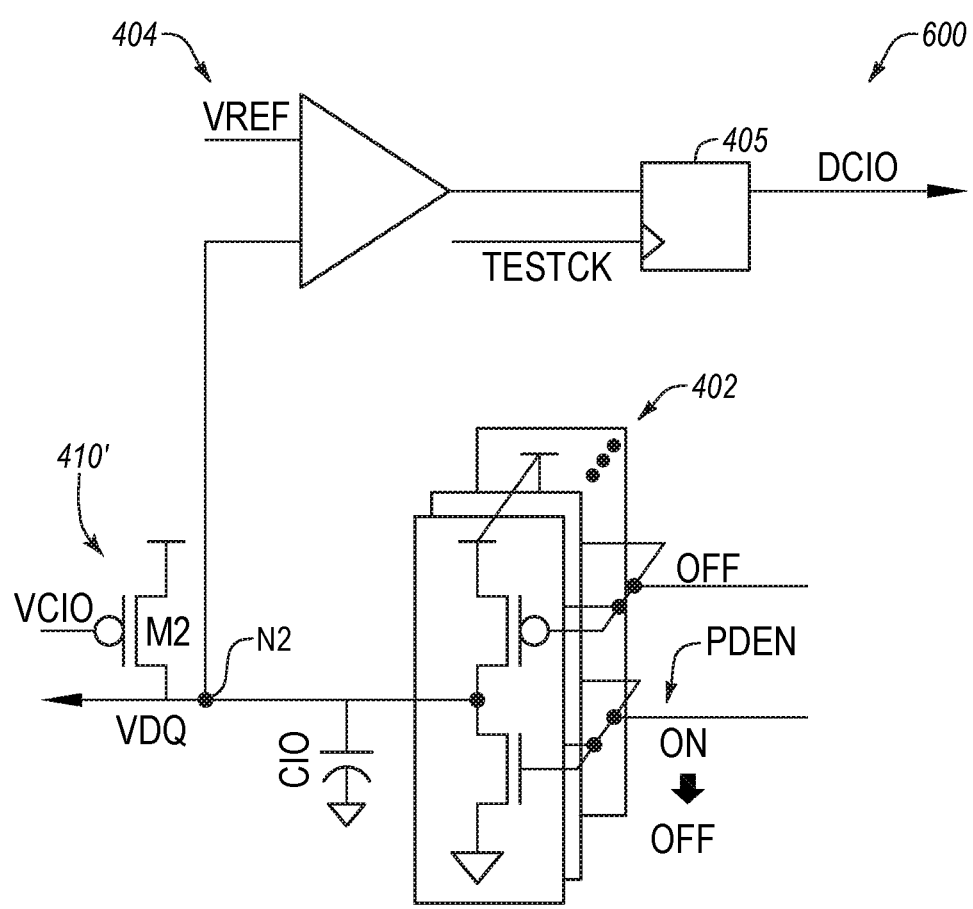
FIG. 6 depicts yet another example circuit of a semiconductor device, according to various embodiments of the present disclosure.

Although FIG. 4A depicts a current source (e.g., current source 410) including an NMOS transistor, the description is not so limited. Rather, as illustrated in a circuit (e.g., "I/O circuit") 600 of FIG. 6, a current source 410' includes a PMOS transistor (i.e., transistor M2). In these embodiments, rather than enabling a pull-up driver of output buffer 402, a pull-down driver of output buffer 402 may be enabled to couple node N2 to a voltage, such as an operating voltage VSS (also referred to herein as a "supply voltage" or "low-side supply voltage"). Further, rather than using a high-side reference voltage, a low-side reference voltage (i.e., voltage reference VREF) may be used. For example, a current source including a PMOS transistor, as shown in FIG. 6, may be used in embodiments wherein generation of a high-side voltage reference (e.g., voltage reference VREF) is difficult.

Figure 7:
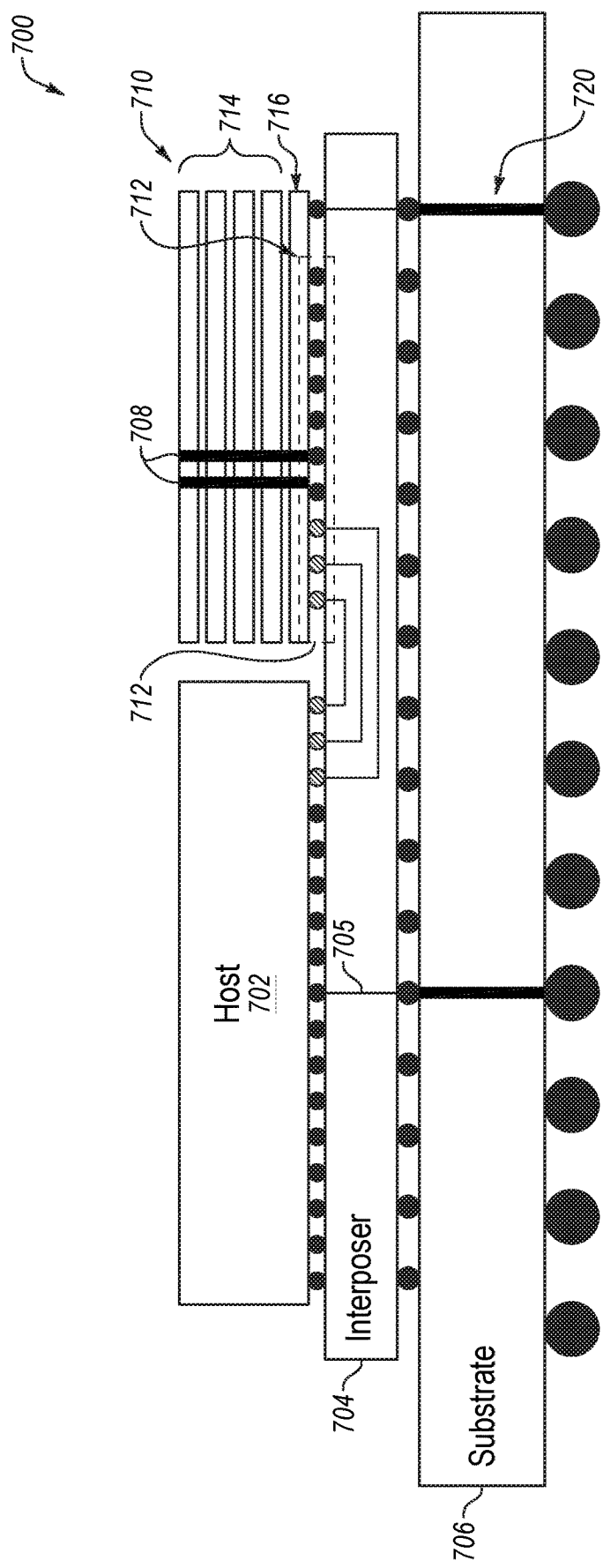
FIG. 7 illustrates an example system including a memory device, in accordance with various embodiments of the present disclosure.

FIG. 7 depicts a system 700, in accordance with various embodiments of the present disclosure. System 700, which may also be referred to herein as a "system-in-package" or a "semiconductor package," includes a host 702, an interposer 704, and a substrate 706. System 700 further includes conductive vias 705 (two shown) in interposer 704, and a device 710, which may include, for example, a number of DRAM dies (e.g., a high bandwidth memory (HBM) stack of DRAM dies 714) stacked on a logic die 716, the dies 714, 716 mutually connected by aligned through silicon vias (TSVs) 708 and discrete conductive elements in the bond lines between the dies 714, 716.

As shown, device 710 may include a core die 714 and logic die 716. Core die 714 may include the number of DRAM dies, and logic die 716 may include circuitry (e.g., interface circuitry such as input/output circuit 162 of FIG. 1 and/or other circuitry). According to various embodiments, core die 714 and/or logic die 716 may include one or more of the various devices and/or circuits described herein (e.g., memory device 100 of FIG. 1, circuit 400 of FIG. 4A, device 500 of FIG. 5, circuit 600 of FIG. 6). In some embodiments, core die 714 and logic die 716 may be connected via a TSV.

System 700, and more specifically logic die 716, may also include an input/output device 712 including, for example, a number of micro bumps for coupling device 710 to host 702 and/or other devices. Although FIG. 7 illustrates device 710 coupled to host 702 via only three (3) micro bumps, device 710 may be coupled to host 702 via any suitable number of micro bumps (e.g., each illustrated micro bump of input/output device 712). By way of non-limiting example, logic die 716 may include one or more output drivers for driving output signals to host 702. According to various embodiments, a comparison result (e.g., voltage DCIO; see e.g., FIG. 4A), may be read out via a test interface 720, which may include, for example, a DA interface or IEEE1500 interface.

Figure 8:
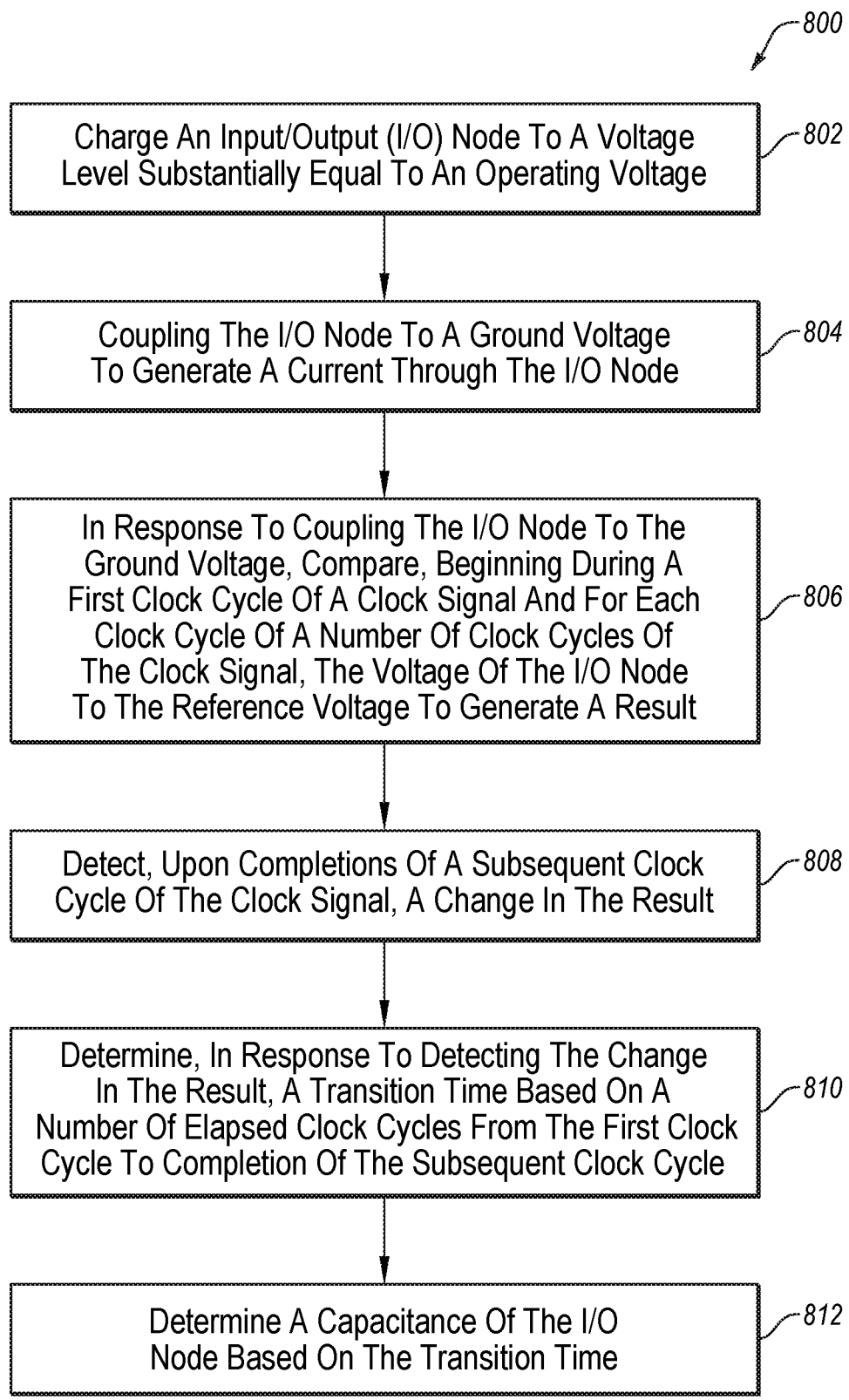
FIG. 8 is a flowchart of an example method of measuring an input/output capacitance, in accordance with various embodiments of the present disclosure.

FIG. 8 is a flowchart of an example method 800 of measuring an I/O capacitance, in accordance with various embodiments of the disclosure. Method 800 may be arranged in accordance with at least one embodiment described in the present disclosure. Method 800 may be performed, in some embodiments, by a device or system, such as memory device 100 of FIG. 1, circuit 400 of FIG. 4A, device 500 of FIG. 5, circuit 600 of FIG. 6, system 700 of FIG. 7, system 900 of FIG. 9, and/or system 1000 of FIG. 10, or another device or system. Although illustrated as discrete blocks, various blocks may be divided into additional blocks, combined into fewer blocks, or eliminated, depending on the desired implementation.

Method 800 may begin at block 802, wherein an input/output (I/O) node may be charged to a voltage level substantially equal to an operating voltage, and method 800 may proceed to block 804. For example, the I/O node (e.g., I/O node N2; see FIG. 4A) may be charged to the voltage level of the operating voltage (e.g., VDD) by coupling the I/O node to the operating voltage via an output buffer (e.g., output buffer 402 of FIG. 4A).

At block 804, the I/O node may be coupled to a ground voltage to generate a current through the I/O node, and method 800 may proceed to block 806. For example, the I/O node (e.g., I/O node N2; see FIG. 4A) may be coupled to the ground voltage via a current source, such as transistor M1 of FIG. 4A, to generate the current though the I/O node.

At block 806, in response to coupling the I/O node to the ground voltage, the voltage of the I/O node may be compared to a reference voltage to generate a result ("comparison result"), and method 800 may proceed to block 808. More specifically, for example, beginning during a first clock cycle of a clock signal (e.g., clock signal TESTCK of FIGS. 4A and 4B) and for each clock cycle of a number of clock cycles of the clock signal, the voltage of the I/O node (e.g., I/O node N2; see FIG. 4A) may be compared to the reference voltage (e.g., reference voltage VREF of FIG. 4A) to generate a result (e.g., comparison result DCIO of FIGS. 4A and 4B). According to some embodiments, the reference voltage (e.g., reference voltage VREF of FIG. 4A) may be less than the operating voltage.

At block 808, a change in the result may be detected, and method 800 may proceed to block 810. More specifically, for example, change in the result may be detected during and/or upon completion of a subsequent clock cycle of the number of clock cycles of the clock signal.

At block 810, a transition time based on a number of elapsed clock cycles from the first clock cycle to completion of the subsequent clock cycle may be determined, and method 800 may proceed to block 812. For example, the transition time may be determined via a period of the clock cycles and a number of elapsed clock cycles.

At block 812, a capacitance of the I/O node may be determined based on the determined transition time. More specifically, for example, the capacitance of the I/O node may be determined based on the determined transition time, a magnitude of the current, a magnitude of the reference voltage, and a magnitude of the operating voltage. For example, a control unit (also referred to herein as a "controller" or "control unit") (e.g., control unit 165 of FIG. 1) may be configured to perform one or more of the acts of blocks 808, 810, and 812.

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein the comparison result is latched via a flip-flop. Further, a method may include one or more acts wherein the comparison result is output from the flip-flop in response receipt of an edge of clock signal at the flip-flop. Moreover, a method may include one or more acts wherein the I/O node is isolated from the operating voltage (e.g., substantially simultaneously as the I/O node is coupled to the ground voltage).

A memory system is also disclosed. According to various embodiments, the memory system may include one or more memory devices including one or more memory cell arrays, such as memory cell array 102 (see FIG. 1). The one or more memory cell arrays may include a number of memory cells.

Figure 9:
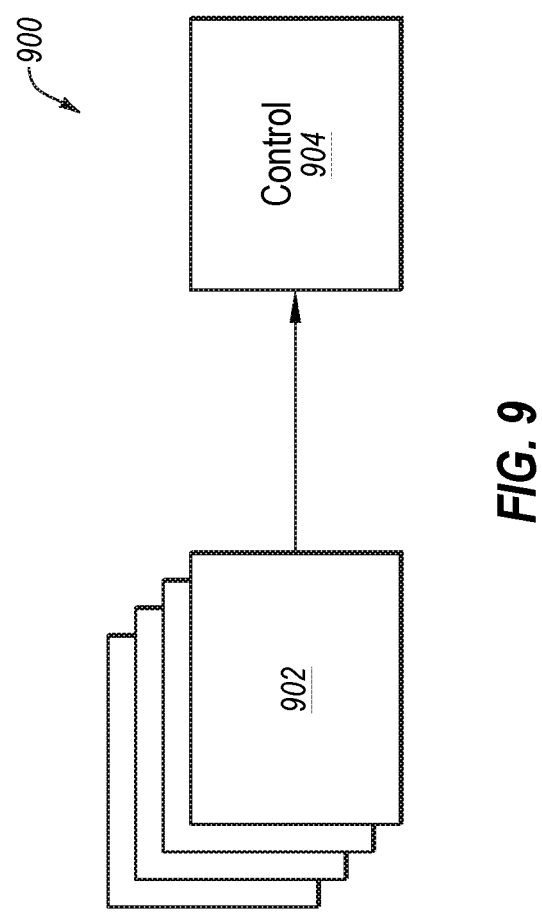
FIG. 9 is a simplified block diagram of an example memory system, in accordance with various embodiments of the present disclosure.

FIG. 9 is a simplified block diagram of a memory system 900 implemented according to one or more embodiments described herein. Memory system 900, which may include, for example, one or more semiconductor devices, includes a number of memory devices 902 and control 904. Each memory device 902, which may include a number of memory banks, may include a number of memory cells.

Control 904 may be operatively coupled with each memory device 902 so as to enable data to be read from or written to any or all memory cells within each memory device 902. Control 904 and/or memory devices 902 may include one or more of the various devices and/or circuits described herein (e.g., memory device 100 of FIG. 1, circuit 400 of FIG. 4A, device 500 of FIG. 5, and/or circuit 600 of FIG. 6).

A system is also disclosed. According to various embodiments, the system may include a memory device including a number of memory banks, each memory bank having an array of memory cells. Each memory cell may include an access transistor and a storage element operably coupled with the access transistor.

Figure 10:
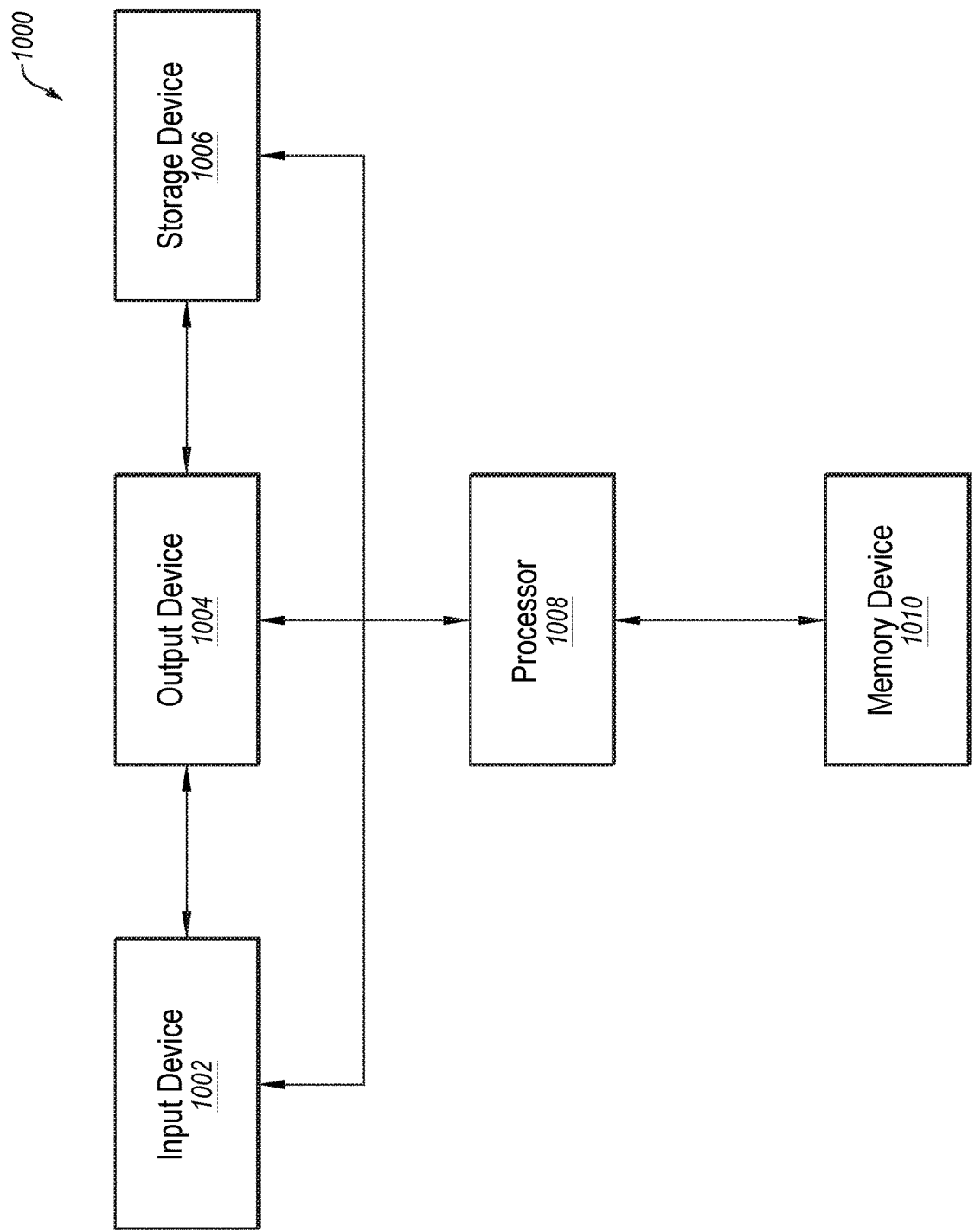
FIG. 10 is a simplified block diagram of an example electronic system, in accordance with various embodiments of the present disclosure.

FIG. 10 is a simplified block diagram of an electronic system 1000 implemented according to one or more embodiments described herein. Electronic system 1000 includes at least one input device 1002, which may include, for example, a keyboard, a mouse, or a touch screen. Electronic system 1000 further includes at least one output device 1004, such as a monitor, a touch screen, or a speaker. Input device 1002 and output device 1004 are not necessarily separable from one another. Electronic system 1000 further includes a storage device 1006. Input device 1002, output device 1004, and storage device 1006 may be coupled to a processor 1008. Electronic system 1000 further includes a memory device 1010 coupled to processor 1008. Memory device 1010, which may include at least a portion of memory system 900 of FIG. 9, may include an array of memory cells. Electronic system 1000 may include, for example, a computing, processing, industrial, or consumer product. For example, without limitation, system 1000 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

As described herein, various embodiments may allow for pin capacitance measurements without pin contact (e.g., via a measurement tool). Also, in comparison to conventional devices, various embodiments can generate a source current (e.g., current Ic of FIG. 4A) via a controlling voltage (e.g., voltage VCIO), and various embodiments do not require implementation of a small current driver or a fine duty high speed clock. Moreover, various embodiments provide for PVT variation compensation (e.g., via a replica DQ cell) and adjusting one or more operation parameters (e.g., reference voltage VCIO). Various embodiments may be useful for not only a HBM devices, but also other devices that utilize a uBump (or similar) interface.

Various embodiments of the present disclosure may include a device including a first circuit coupled to a node and configured to charge the node. The device may further include a current source coupled to the node and configured to couple the node to a ground voltage to generate a current through the node. The device may further include a second circuit coupled to the node and configured to compare, beginning during a first clock cycle of a clock signal and for each clock cycle of a number of clock cycles of the clock signal, a voltage at the node to a reference voltage to generate a result. Furthermore, the device may include a control unit. The control unit may be configured to detect, upon completion of a subsequent clock cycle of the clock signal, a change in the result. The control unit may further be configured to determine, in response to the change in the result, a transition time based on a number of elapsed clock cycles from the first clock cycle to completion of the subsequent clock cycle to determine a capacitance of the node based on the transition time.

One or more other embodiments of the present disclosure include a method. The method may include charging an input/output (I/O) node to a voltage level substantially equal to an operating voltage, wherein the operating voltage is greater than a reference voltage. The method may further include coupling the I/O node to a ground voltage to generate a current through the I/O node. Moreover, the method may include, in response to coupling the I/O node to the ground voltage, comparing, beginning during a first clock cycle of a clock signal and for each clock cycle of a number of clock cycles of the clock signal, the voltage of the I/O node to the reference voltage to generate a result. The method may also include detecting, upon completion of a subsequent clock cycle of the clock signal, a change in the result. Moreover, the method may include determining, in response to detecting the change in the result, a transition time based on a number of elapsed clock cycles from the first clock cycle to completion of the subsequent clock cycle. The method may further include determining a capacitance of the I/O node based on the transition time.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and comprising an input/output (I/O) node configured selectively coupled to an operating voltage. The memory device may further include a current source coupled to the I/O node and configured to, during a first clock cycle of a number of clock cycles of a clock signal, couple the I/O node to a ground voltage to generate an I/O current. The memory device may also include a comparator coupled to the I/O node and a reference voltage and configured to generate a result. The electronic system may further include a controller configured to detect a change in the result during a subsequent clock cycle of the number of clock cycles of the clock signal. The controller may further be configured to determine a capacitance of the I/O node based on a number of elapsed clock cycles from the first clock cycle to completion of the subsequent clock cycle and a frequency of the clock signal.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a first circuit coupled to a node and configured to charge the node;
   a current source coupled to the node and configured to couple the node to a ground voltage to generate a current through the node;
   a second circuit coupled to the node and configured to compare, beginning during a first clock cycle of a clock signal and for each clock cycle of a number of clock cycles of the clock signal, a voltage at the node to a reference voltage to generate a result; and
   a control unit configured to:
      detect, upon completion of a subsequent clock cycle of the clock signal, a change in the result; and
      determine, in response to the change in the result, a transition time based on a number of elapsed clock cycles from the first clock cycle to completion the subsequent clock cycle to determine a capacitance of the node.

2. The device of claim 1, wherein the first circuit comprises an output buffer configured to:

couple the node to an operating voltage in response to being enabled to charge the node; and isolate the node from the operating voltage in response to being disabled.

3. The device of claim 1, wherein the second circuit comprises a comparator having a first input coupled to the node and a second input coupled to the reference voltage.

4. The device of claim 3, further comprising a flip-flop coupled to an output of the comparator and configured to receive the clock signal.

5. The device of claim 1, wherein the current source comprises a transistor coupled between the node and the ground voltage.

6. The device of claim 5, wherein the first circuit is configured to charge the node to a voltage level substantially equal to an operating voltage, and wherein the reference voltage is less than the operating voltage.

7. The device of claim 5, wherein the first circuit is configured to charge the node to a voltage level substantially equal to an operating voltage, and wherein a value of a voltage applied to a gate of the transistor is less than a value of the operating voltage.

8. The device of claim 1, wherein the control unit is configured to determine the capacitance of the node based on the transition time, a magnitude of the current, an operating voltage, and the reference voltage.

9. A method, comprising:

charging an input/output (I/O) node to a voltage level substantially equal to an operating voltage, the operating voltage being greater than a reference voltage;

coupling the I/O node to a ground voltage to generate a current through the I/O node;

in response to coupling the I/O node to the ground voltage, comparing, beginning during a first clock cycle of a clock signal and for each clock cycle of a number of clock cycles of the clock signal, the voltage of the I/O node to the reference voltage to generate a result;

detecting, upon completions of a subsequent clock cycle of the clock signal, a change in the result;

determining, in response to detecting the change in the result, a transition time based on a number of elapsed clock cycles from the first clock cycle to completion of the subsequent clock cycle; and determining a capacitance of the I/O node based on the transition time.

10. The method of claim 9, wherein charging a voltage of an input/output (I/O) node to a voltage level substantially equal to the operating voltage comprises coupling the I/O node to the operating voltage via an output buffer.

11. The method of claim 9, wherein comparing the voltage of the I/O node to the reference voltage comprises comparing, via a comparator, the voltage of the I/O node to the reference voltage.

12. The method of claim 11, further comprising latching the result via a flip-flop coupled to an output of the comparator.

13. The method of claim 12, further comprising outputting the result from the flip-flop in response receipt of an edge of the clock signal at the flip-flop.

14. The method of claim 9, further comprising isolating the I/O node from the operating voltage, wherein the I/O node is isolated from the operating voltage and coupled to the ground voltage substantially simultaneously.

15. The method of claim 9, wherein determining the capacitance of the I/O node comprises determining the capacitance of the I/O node based on the transition time, the current, the operating voltage, and the reference voltage.

16. A system comprising:

at least one input device;

at least one output device;

at least one processor device operably coupled to the input device and the output device; and at least one memory device operably coupled to the at least one processor device and comprising:

an input/output (I/O) node configured to be selectively coupled to an operating voltage;

a current source coupled to the I/O node and configured to, during a first clock cycle of a number of clock cycles of a clock signal, couple the I/O node to a ground voltage to generate an I/O current; and a comparator coupled to the I/O node and a reference voltage and configured to generate a comparison result; and a controller configured to:

detect a change in the comparison result during a subsequent clock cycle of the number of clock cycles of the clock signal; and determine a capacitance of the I/O node based on a number of elapsed clock cycles from the first clock cycle to completion of the subsequent clock cycle and a frequency of the clock signal.

17. The system of claim 16, wherein the memory device comprises a high-bandwidth memory (HBM) device.

18. The system of claim 16, wherein the memory device further comprises an output buffer for selectively coupling the I/O node to the operating voltage.

19. The system of claim 16, wherein the current source comprises an NMOS transistor or a PMOS transistor.

20. The system of claim 16, wherein the memory device further comprises a flip-flop configured to receive the result from the comparator and the clock signal, wherein the flip-flop is further configured to output the result upon completion of each clock cycle of the number of clock cycles.

* * * * *

UNITED STATES PATENT AND TRADEMARK OFFICE
CERTIFICATE OF CORRECTION

PATENT NO. : 11,302,387 B2
APPLICATION NO. : 16/927535
DATED : April 12, 2022
INVENTOR(S) : Hyunui Lee It is certified that error appears in the above-identified patent and that said Letters Patent is hereby corrected as shown below:

In the Specification

| | | |
|---|---|---|
| Column 2, | Line 32, | change "and/BL," to --and /BL,-- |
| Column 2, | Line 34, | change "and/BL." to --and /BL.-- |
| Column 2, | Line 36, | change "and/BL" to --and /BL-- |
| Column 2, | Line 42, | change "and/BL" to --and /BL-- |
| Column 2, | Line 43, | change "or/BL" to --or /BL-- |
| Column 2, | Line 52, | change "or/BL." to --or /BL.-- |

Signed and Sealed this
Thirtieth Day of August, 2022

Katherine Kelly Vidal
*Director of the United States Patent and Trademark Office*